Sept. 23, 1952 A. H. ROCHE 2,611,833

ELECTRIC AMPLIFIER WITH NEGATIVE FEEDBACK

Filed Feb. 7, 1947 2 SHEETS—SHEET 1

Inventor
Alleman Holly Roche
By
Robert Harding Jr.
Attorney

Inventor
Alleman Holly Roche
By Robert Harding Jr.
Attorney

Patented Sept. 23, 1952 2,611,833

UNITED STATES PATENT OFFICE 2,611,833

ELECTRIC AMPLIFIER WITH NEGATIVE FEEDBACK

Alleman Holly Roche, London, England, assignor to International Standard Electric Corporation, New York, N. Y., a corporation of Delaware Application February 7, 1947, Serial No. 727,208
In Great Britain April 30, 1946

1 Claim. (Cl. 179—171)

The present invention relates to electric wave amplifiers having negative feed-back, and is concerned with arrangements for compensating for the gain variations resulting from the ageing of the valves of the amplifier.

During the life of an amplifying valve, the anode current tends continually to decrease and at the same time the mutual conductance or slope of the valve also decreases, so that the gain of the amplifier decreases. When an amplifier is provided with stabilising negative feed-back, this gain reduction is to some extent compensated by the negative feed-back, but the degree of compensation depends on the frequency and it is known that generally the compensation is practically complete at the extreme ends of the frequency band for which the amplifier is designed, but is only partial for frequencies near the middle of the band. In order to minimise the importance of this effect, it has previously been proposed slightly to modify the gain-frequency characteristic of the amplifier so that when the valves are new, the gain at frequencies near the middle of the band is slightly too high, and so that at the end of the life of the valves the gain at these frequencies is approximately the same amount too low. This method has the objection that the gain characteristic of the amplifier is correct only for a comparatively short period at the middle of the life of the valves.

It is the principal object of the present invention to provide an arrangement by means of which the gain-frequency characteristic of the amplifier is continuously corrected during the ageing period of the valves, so that it has the prescribed form substantially for the whole of their lives.

This object is achieved according to the invention by providing an amplifier having a forward amplifying path and a negative feed-back path, comprising means under the control of the anode current of one or more of the valves in the forward amplifying path whereby the gain of the amplifier at certain frequencies is adjusted by an amount depending on the magnitude of the said anode current. In a different form of the invention, the means under control of the anode current is provided for maintaining substantially unaltered the gain-frequency characteristic of the amplifier in spite of the ageing of the valves.

The invention will be described with reference to the accompanying drawings, in which.

As has already been mentioned, the gain variations caused by the ageing of the valves in an amplifier are only partly stabilised by negative feedback. It is well known that stabilisation is practically complete at frequencies for which the phase shift round the feed-back loop is 90° or 270°, and not so good at frequencies where the phase shift is 180°. Thus, referring to Fig. 1, $F_1$ and $F_2$ are the maximum and minimum frequencies of the band to be transmitted, and curve 1 gives an example of the specified gain frequency characteristic of a negative feed-back amplifier which it has when the valves are new. Towards the end of the life of the valves it may be found that the characteristic has changed to the dotted line 2. At frequencies $F_1$ and $F_2$ the loop phase shift is usually in the neighbourhood of 90° or 270°, so as already explained, the gain does not change appreciably at these frequencies. At the centre of the frequency band, however, the loop phase shift is near 180° and the gain is reduced in the manner indicated by curve 2 at the end of the life of the valves.

According to the previous proposal already referred to, the gain of the amplifier is modified so that when the valves are new, the characteristic produced lies above the curve 1 by an amount substantially equal to half the difference between the curves 1 and 2, so that while the departure from the desired characteristic does not exceed half the maximum difference between the two curves, the specified characteristic is only obtained for a short period of time.

Figure 2:
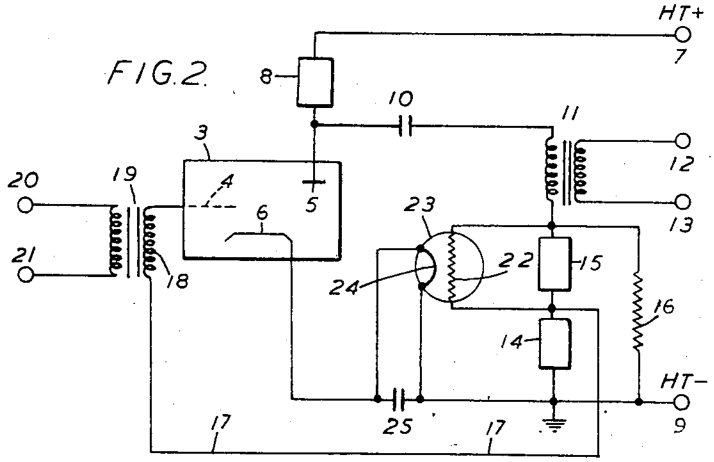
Fig. 2 shows a simplified schematic circuit diagram of an amplifier having means for correcting the gain-frequency characteristic according to the invention.

According to the present invention, however, the gain characteristic is continually corrected during the ageing period of the valves so that at all times it coincides substantially with the specified curve. Fig. 2 shows one arrangement by which this continuous correction is effected. In Fig. 2, the block 3 represents the forward amplifying path of the amplifier. It may consist of any number of stages of amplification arranged in any known way. Only the control grid 4 of the first valve and the anode 5 of the last valve are indicated; and 6 represents one or more of the valve cathodes which are usually connected in parallel to the negative terminal of the high tension source through bias networks or the like (not shown).

The anode 5 is connected to the positive high tension terminal 7 through an appropriate load impedance or network 8. The negative high tension terminal 9 will usually be grounded, either directly, as shown, or through a large by-pass condenser. Amplified signals are taken from the anode 5 through a blocking condenser 10 and through an output transformer 11, the secondary winding of which is connected to output terminals 12 and 13.

The primary winding of the transformer 11 is connected to terminal 9 through two impedance networks 14 and 15, connected in parallel with a resistance 16, and a feed-back connection 17 is taken from the junction point of these two impedances to the control grid 4 through the secondary winding 18 of the input transformer 19, the primary winding of which is connected to the input terminals 20 and 21, to which the signals to be amplified are applied.

According to the invention, the resistance element 22 of an indirectly heated thermistor 23 is connected across the network 15, and the heating coil 24 is connected in series between the cathode 6 and the terminal 9, a by-pass condenser 25 being provided to shunt the heating coil. A suitable indirectly heated thermistor is described in British patent specifications Nos. 541,922, 555,563 or 557,559.

It will be evident that the attenuation of the feed-back path depends on the values of the impedances 14, and 15 shunted by 22. The resistance 22 depends on the magnitude of the current which flows from the cathode 6 through the heating coil 24 of the thermistor 23, and the current is equal to the sum of the anode currents of all the valves of the forward amplifying path 3 whose cathodes are included in 6. If, as is commonly the case, the thermistor has a negative temperature coefficient of resistance, the resistance 22 will be relatively small when the valves are new and the combined anode current is large. The networks 14 and 15 will be designed according to known principles so that in this condition the complete amplifier has the specified gain-frequency characteristic, such as curve 1, Fig. 1.

Figure 1:
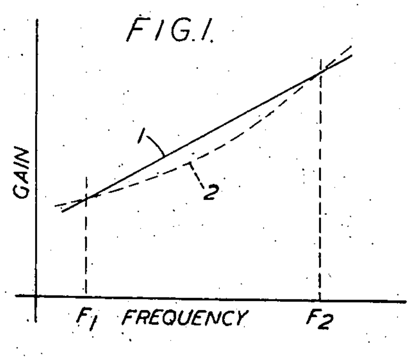
Fig. 1 shows gain-frequency chraracteristics of an amplifier with negative feed-back in order to indicate the effects of ageing of the valves.

As already explained, when the valves are old, the amplifier tends to have a characteristic like curve 2, Fig. 1. However, in this condition, the combined anode current is smaller than before, so that the resistance 22 is increased. The networks 14 and 15 will therefore be so designed that slightly reduced feed-back is produced at the middle of the frequency band by the amplifier but not at the ends, so that the curve 2 is corrected to coincide with the curve 1.

In order to obtain this sort of correction, network 15 should have the characteristics of a parallel resonant circuit.

It will be understood that the heating coil 24 of the thermistor 23 may be connected in series with only one of the cathodes of the valves in the forward amplifying path 3, or in series with any number of them. In general, of course, it is preferable to include all the cathodes, since thereby the effects of ageing of all the valves will be used for controlling the thermistor. For all cases, of course, the heating coil should be shunted by a by-pass condenser 25 in order to keep the signal currents out of the thermistor.

Figure 3:
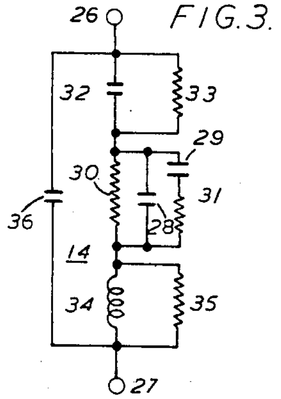
Figs. 3 and 4 show details of networks which may be used in the circuit of Fig. 2.

Fig. 3 shows an example of a suitable configuration for the network 14 of Fig. 2, which gives a characteristic of the type shown by curve 1 of Fig. 1. Connected in series between the terminals 26 and 27 are three meshes of which the centre mesh consists of condensers 28 and 29 and resistances 30 and 31 arranged in the manner shown. These are the principal elements of the network, and produce the general form of the desired characteristic. The other meshes consisting respectively of condenser 32 shunted by resistance 33, and inductance 34 shunted by resistance 35, are introduced to assist in the shaping of the characteristics of the feed-back loop as explained, for example, in British patent specifications Nos. 499,315 and 514,567. The condenser 36 represents the unavoidable capacity acting across the feed-back path, which must be taken into account, and does not represent an actual element which has to be provided.

Figure 4:
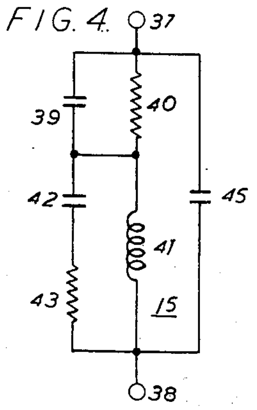

The network 15 is Fig. 2 may be as shown in Fig. 4. The requirements are that the impedance of the network shall not change when the thermistor resistance changes, at frequencies where the loop phase-change of the amplifier is 90° or 270°, and shall change by the required amount at frequencies where the loop phase change is 180°. The maximum change will be small in most practical cases. The network of Fig. 4 accordingly comprises between the terminals 37 and 38 two meshes consisting respectively of a condenser 39 shunted by a resistance 40 and an inductance 41 shunted by a series combination of a condenser 42 and a resistance 43. A condenser 45 connected between the terminals 37 and 38 assists in shaping the feed-back loop characteristic at high frequencies.

This network includes the parallel resonant combination referred to above, consisting of the elements 41 and 42. The network elements should be chosen so that its impedance at frequencies $F_1$ and $F_2$ is small compared with the resistance 22 of the thermistor 23, so that at these frequencies, the thermistor does not appreciably affect the feed-back. If the elements 41, 42 resonate at a frequency near the middle of the band, the impedance of the network will increase so that the thermistor then has the necessary effect in reducing the feed-back as the valves age.

It will be evident that it is necessary to determine the relation between the anode current of the valves and the corresponding mutual conductance under the specified operating condition of the valves in order that the values of the elements of Figs. 3 and 4, may be determined. When this relation and the requirements for the amplifier are given, those skilled in the art will have no difficulty in designing the networks whose configuration has been given.

Various other configurations are possible for the networks 14 and 15; and the resistance element 22 of the thermistor might be arranged in series or in shunt with part only of the network 15.

Similar principles may be applied to amplifiers in which the feed-back path takes other forms. For example, when the feed-back is obtained by means of input and/or output bridges, the thermistor may be connected in such manner as to operate on one of the arms of one of the bridges or on a diagonal thereof.

It is also possible to employ several thermistors, the resistance elements of which are connected in various parts of the feed-back path, the heating coils being connected in series with one or more of the valves in the forward amplifying path, and other kinds of non-linear resistance elements such as voltage-dependent resistances and rectifiers could be employed in conjunction with the thermistors.

There are also other ways in which the gain frequency characteristic of the amplifier could be corrected under the control of the valve anode currents. For example, the resistance element of the thermistor could be included in one of the interstage coupling networks in the forward amplifying path in such manner as to increase the gain of the forward path in the desired manner throughout the frequency band as the mutual conductance of the valves decreases during the ageing period. Alternatively the thermistor could operate on a local feed-back path provided for one of the valves in the forward amplifying path, so as suitably to vary the frequency selectivity of that valve. In such cases each such interstage coupling network, or valve, could be provided with a separate controlling thermistor, all the thermistors being controlled by the anode current of one or more of the valves.

Finally, one or more thermistors could be associated with the input and/or output transformer of the amplifier in order to control their frequency characteristics in such a manner as suitably to correct the gain frequency characteristic of the amplifier. Any combination of these various methods could clearly be employed.

Figure 5:
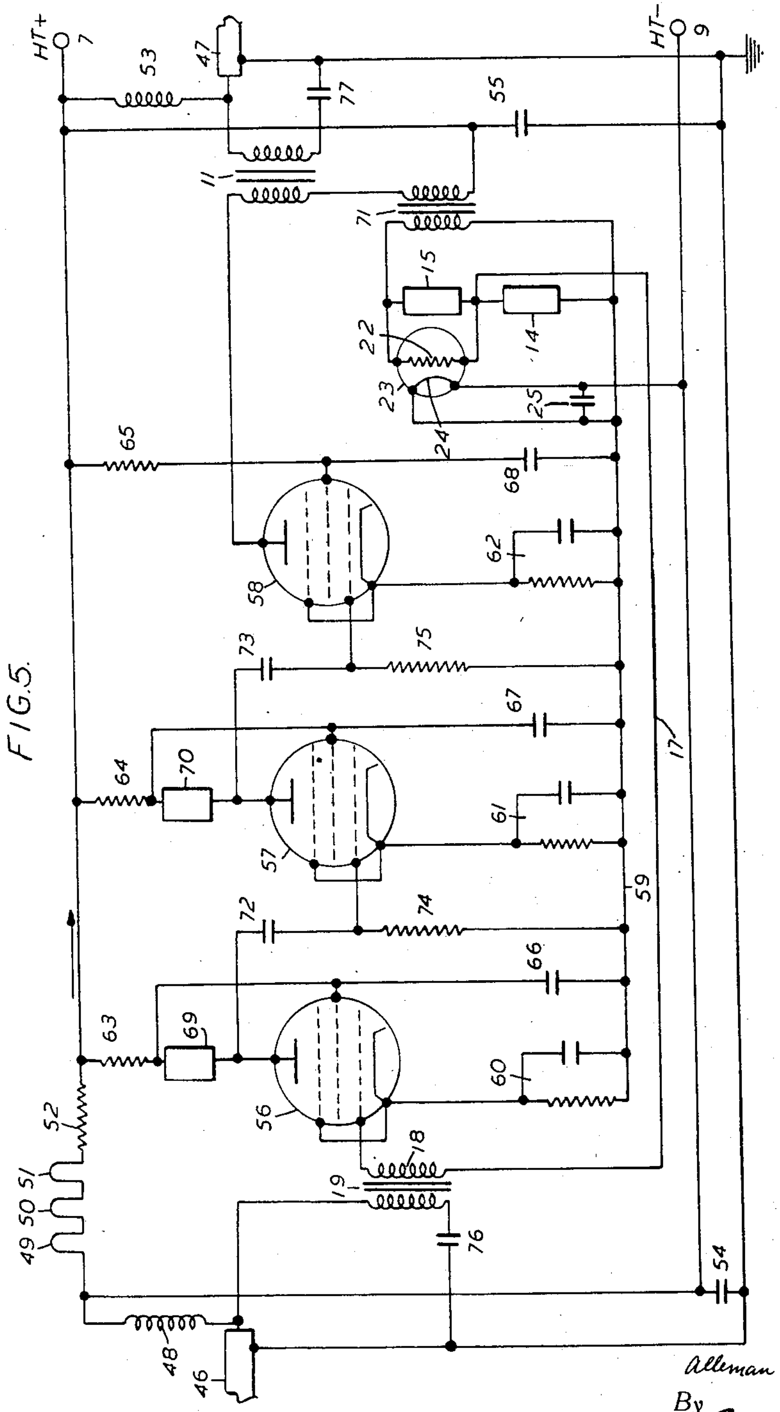
Fig. 5 shows a detailed schematic circuit diagram of an amplifier incorporating the features of the invention.

A practical example of an amplifier employing an arrangement according to the invention is shown in Fig. 5. This is a three stage amplifier intended to be installed at an unattended station and to be supplied with operating power from a central or control station over the conductors which carry the signal currents to be amplified. Such an amplifier is suitable, for example, for use as a submerged repeater on a long submarine cable.

Fig. 5, as far as the features of the invention are concerned, is similar to Fig. 2, and similar elements in both figures will be given the same designation numbers.

The circuits connected to the input and output of the amplifier are shown as co-axial lines 46 and 47, the outer conductors of which are connected to ground. In order to supply operating power for the amplifier, the positive terminal of a direct current source (not shown) is connected to the inner conductor of the line 46 at a preceding station, the negative terminal being grounded. The inner conductor of the line 46 is connected through an inductance 48, through the cathode heaters 49, 50 and 51 (shown separately from the three valves for clearness), in series with a resistance 52 and through a second inductance 53 to the inner conductor of the line 47, and thence to other unattended amplifiers (if any) and finally to ground. The current is adjusted to the value required for the cathode heaters, and the resistance 52 is chosen so that the total drop of potential across the heaters and this resistance is equal to the high tension voltage specified for the amplifier. If high resistance heaters are used, the resistance 52 may not be required.

The positive high tension terminal 7 for the amplifier is accordingly the junction point of elements 52 and 53, and the negative terminal 9 is the junction point of elements 48 and 49. In this case terminal 9 cannot be directly grounded, but is effectively connected to ground by a by-pass condenser 54 which also forms a low pass filter with the inductance 48 for separating the signal and power currents. Likewise a by-pass condenser 55 forms a similar low-pass filter with the inductance 53.

The three valves 56, 57 and 58 are shown as similar pentodes arranged in a conventional way. The three cathodes are connected to a common conductor 59 through bias networks 60, 61 and 62. The common conductor 59 is connected to terminal 9 through the thermistor heating coil 24 shunted by the by-pass condenser 25. The suppressor grids of the valves are directly connected to the respective cathodes and the screen grids are connected to terminal 7 through corresponding resistances 63, 64 and 65 and to the common conductor 59 through by-pass condensers 66, 67 and 68. The anodes of the valves 56 and 57 are connected through appropriate networks 69 and 70 and through resistances 63 and 64 to terminal 7, and the anode of valve 58 is connected through the primary winding of the output transformer 11 and through the primary winding of the feed-back circuit coupling transformer 71 to terminal 7. The control grids of the valves 57 and 58 are connected to the anodes of the respective preceding valves 56 and 57 through coupling condensers 72 and 73, and to the common conductor 59 through the usual high resistances 74 and 75. The control grid of the valve 56 is connected through the secondary winding 18 of the input transformer 19 to the feed-back conductor 17. The secondary winding of the feed-back circuit coupling transformer 71 is connected across the networks 14 and 15 which with the thermistor 23 are arranged as in Fig. 2. The only difference in this part of the circuit from Fig. 2 is the interposition of the transformer 71 instead of the resistance 16 which does not affect the principle of operation of the circuit.

One terminal of the primary winding of the input transformer 19 is connected to the inner conductor of the coaxial line 46 and the other terminal is connected to the outer conductor through the blocking condenser 76. Similarly, one terminal of the secondary winding of the output transformer 11 is connected to the inner conductor of the coaxial line 47, and the other terminal is connected to the outer conductor through the blocking condenser 77.

Except as regards the particular features of the invention which are concerned with the elements 14, 15 and 23, the amplifier will be recognised as of well-known type. The manner in which the frequency characteristic is corrected will be as described with reference to Fig. 2 and need not be again explained.

In Fig. 5 the networks 14 and 15 may take the forms shown respectively in Figs. 3 and 4 or any other suitable forms.

It will be understood, of course, that the invention is applicable to an amplifier having any kind of gain-frequency characteristic which is not necessarily similar to curve 1 of Fig. 1. For example the characteristic could be flat, or tilted the other way and it need not be substantially straight.

It is to be noted, also, that the negative feedback does produce some incomplete stabilisation against ageing at frequencies where the loop phase change is 180°, and the amount of stabilisation will be the greater as the gain around the feed-back loop is the greater. Thus when this gain is large, the amount of additional correction which must be effected by the arrangement according to the invention will be small.

What is claimed is:

An electric wave amplifier comprising a forward amplifying path including a plurality of thermionic valves each having an indirectly heated cathode, a power source therefor and a separate bias network coupled to said cathode, each of said cathodes being connected through its associated bias network in parallel and to said source, a negative feedback path including an impedance, and an indirectly-heated thermistor having a heating coil serially connected between all of said cathodes through said bias network and said source for passing the cathode current of said valves, said thermistor being connected across at least a portion of said negative feedback impedance for compensating for change in frequency characteristic due to aging of said valves.

ALLEMAN HOLLY ROCHE.

REFERENCES CITED

The following references are of record in the file of this patent:

UNITED STATES PATENTS

| Number | Name | Date |
|---|---|---|
| 2,151,829 | Barton | Mar. 28, 1939 |
| 2,178,072 | Fritzinger | Oct. 31, 1939 |
| 2,350,951 | Zinn | June 6, 1944 |
| 2,367,711 | Bode | Jan. 23, 1945 |
| 2,428,363 | Elmendorf | Oct. 7, 1947 |
| 2,432,033 | Nicholson, Jr. | Dec. 2, 1947 |
| 2,468,082 | Chatterjea et al. | Apr. 26, 1949 |

FOREIGN PATENTS

| Number | Country | Date |
|---|---|---|
| 119,554 | Australia | Feb. 12, 1945 |